(12) United States Patent
Kuhwald et al.

(10) Patent No.: US 8,040,125 B2
(45) Date of Patent: Oct. 18, 2011

(54) DEVICE AND METHOD FOR THE ANALYSIS OF A MEASURED SIGNAL TRANSMITTED VIA A MULTI-CHANNEL SYSTEM

(75) Inventors: Thomas Kuhwald, Markt Schwaben (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 316 days.

(21) Appl. No.: 12/440,442

(22) PCT Filed: Jul. 10, 2007

(86) PCT No.: PCT/EP2007/006102
§ 371 (c)(1),
(2), (4) Date: Mar. 6, 2009

(87) PCT Pub. No.: WO2008/028532
PCT Pub. Date: Mar. 13, 2008

(65) Prior Publication Data
US 2010/0007329 A1      Jan. 14, 2010

(30) Foreign Application Priority Data
Sep. 7, 2006   (DE) .......................... 10 2006 042 114

(51) Int. Cl.
*G01R 23/14* (2006.01)
(52) U.S. Cl. ................ 324/76.43; 324/76.42; 324/76.44
(58) Field of Classification Search .................... None
See application file for complete search history.

(56) References Cited

U.S. PATENT DOCUMENTS

| 4,044,318 | A | 8/1977 | Daly et al. |
| 6,525,522 | B1* | 2/2003 | Pickerd ............ 324/76.58 |
| 7,227,346 | B1 | 6/2007 | Solbrig |
| 2003/0208328 | A1 | 11/2003 | Pickerd |
| 2004/0117143 | A1 | 6/2004 | Tran et al. |
| 2005/0141642 | A1 | 6/2005 | Asami |

FOREIGN PATENT DOCUMENTS

CA      2097397 A1      12/1994

(Continued)

OTHER PUBLICATIONS

International Search Report, WO 2008/028532 Al, Rohde & Schwarz GmbH & Co. KG, Mar. 13, 2008, pp. 21-26.

(Continued)

*Primary Examiner* — Minh N Tang
(74) *Attorney, Agent, or Firm* — Ditthavong Mori & Steiner, P.C.

(57) ABSTRACT

A device, in particular, a multi-channel oscilloscope, for the analysis of at least one measured signal transmitted via a multi-channel system, with several measurement channels. The device includes in each case a sampling device, a baseband mixing device, and a filter device, and an analysis device. The measured signal is supplied to the measurement channels and to the respective sampling devices for simultaneous sampling. The sampled measured signal is supplied to the baseband mixing devices connected downstream of the sampling devices for the mixing of the measured signal down into the baseband, to the filter devices connected downstream of the baseband mixing devices for the decimation of the sampled values of the measured signal in the baseband and to the analysis device connected to the filter devices for the analysis of the measured signal.

16 Claims, 2 Drawing Sheets

FOREIGN PATENT DOCUMENTS

| | | |
|---|---|---|
| DE | 10114052 C1 | 7/2002 |
| EP | 0285238 A1 | 10/1988 |
| EP | 0275136 B1 | 9/1995 |
| EP | 1215813 A1 | 6/2002 |
| WO | 2004093327 A2 | 10/2004 |

OTHER PUBLICATIONS

International Preliminary Report on Patentability, PCT/EP2007/006102, Apr. 16, 2009, pp. 1-17.

\* cited by examiner

DEVICE AND METHOD FOR THE ANALYSIS OF A MEASURED SIGNAL TRANSMITTED VIA A MULTI-CHANNEL SYSTEM

CROSS-REFERENCE TO RELATED APPLICATION

The present application claims priority to PCT Application No. PCT/EP2007/006102, filed on Jul. 10, 2007, and German Patent Application No. 10 2006 042 114.0, filed on Sep. 7, 2006, the entire contents of which are herein incorporated by reference.

BACKGROUND OF THE INVENTION

1. Field of the Invention

The invention relates to a device, in particular, a multi-channel oscilloscope, and to a method for the analysis of a measured signal transmitted via a multi-channel system.

2. Discussion of the Background

In communications technology, a multi-channel system is used for the transmission of signals, in order to increase the data rate per bandwidth used and to reduce the bit-error rate. A multi-channel system can be used, for example, in a wireless communications system, which provides a so-called single-input multiple-output (SIMO) system via one transmission antenna and several reception antennas, or a so-called multiple-input multiple-output (MIMO) system via several transmission antennas and several reception antennas. DE 101 14 052 C1 describes a radio transmission method with multiple transmission and reception antennas operating simultaneously within the same frequency band.

As a prerequisite for a particularly high-quality and accurate analysis and/or recording of the measured signal transmitted via the multi-channel system, the measured signal must be simultaneously de-coupled at outputs of the multi-channel system and simultaneously processed. In this context, with a multi-channel system comprising transmission antennas and reception antennas, it has hitherto generally been the case that a measured signal de-coupled at the one reception antenna is processed with a time offset relative to the measured signal de-coupled at the other reception antenna, that is to say, for example, supplied in a time succession to a sampling device and sampled with a time offset relative to one another. A time-offset processing of the measured signal de-coupled at several reception antennas restricts the measurement rate and leads to an impairment of the analysis results.

SUMMARY OF THE INVENTION

Embodiments of the present invention advantageously provide a device and a method for the analysis of a measured signal transmitted via a multi-channel system, wherein the measured signal is conditioned for the implementation of the analysis at a particularly low technical cost and at a particularly high speed.

Accordingly, the device, which is preferably designed as a multi-channel oscilloscope, comprises several measurement channels, which provide in each case a sampling device, in each case a baseband mixing device and in each case a filter device. In this context, the respective filter device of the respective baseband mixing device and the latter are connected downstream of the respective sampling device. The device also comprises an analysis device connected to the filter device for the analysis, for example, modulation analysis, of the measured signal.

In the method according to the invention, the measured signal is simultaneously supplied to the measurement channels and the sampling devices disposed in the latter and simultaneously sampled in the latter on all measurement channels. A sampled, measured signal provided by the sampling devices is supplied to the baseband mixing devices and mixed synchronously down into a baseband. The sampled measured signal is supplied to the filter devices for decimation of the sampled values and to the analysis device connected downstream of the filter devices for analysis.

The advantages achieved with the invention consist, in particular, in that the measured-signal analysis and/or modulation analysis can be implemented more rapidly by means of the device according to the invention and the method according to the invention, because the sampled measured signal is provided at the end of all measurement channels at the same time. Moreover, a particularly good measurement accuracy can be achieved with the method according to the invention. Furthermore, a bandwidth and recording length available in the measurement device, in particular a multi-channel oscilloscope, is effectively utilized. No further hardware is required in addition to the measurement device, because the outputs of the multi-channel system designed, in particular, as a MIMO system can be coupled directly to the measurement channels of the measuring device. Moreover, the purchasing cost for a measuring device comprising several measurement channels is particularly low by comparison with the purchasing cost for cascaded measuring devices each comprising only one measurement channel.

The number of measurement channels preferably corresponds to the number of outputs of the multi-channel system, in particular, to the number of reception antennas formed as outputs within the multi-channel system, at which the measured signal can be de-coupled.

For the synchronous mixing down of the sampled measured signal on the measurement channels, the baseband mixing devices preferably operate in phase.

According to an advantageous embodiment, the measurement channels provide in each case a further baseband mixing device and in each case a further filter device. The respective, further baseband mixing device, which is preferably connected downstream of the respective further filter device, is connected downstream of the respective filter device. In an expedient further development, the respective first baseband mixing device is used for coarse mixing of the sampled signal, whereas the respective further baseband mixing device is designed for fine mixing of the sampled signal.

According to an advantageous further development, a buffer device for recording the sampled signal determined for the analysis is connected downstream of the filter devices provided on the measurement channels.

In order to achieve an adequate coherence of the measurement channels and to provide a common phase relationship between the measurement channels, the first and/or the further baseband mixing devices and the first and/or the further filter devices are expediently designed to be capable of delay-time calibration. For this purpose, a time-delay element, which is preferably controlled by a common pulse generator, is expediently connected in each case to the first and/or the further baseband mixing devices and to the first and/or the further filter devices.

In this context, a common pulse generator can be connected in each case preferably to the time-delay elements connected to the baseband mixing devices and to the filter devices and to the further baseband mixing devices and to the further filter devices.

In an expedient further development, the real component of the baseband signal and the imaginary component of the baseband signal are obtained in the baseband mixing devices from the sampled measured signal.

In order to mix the sampled measured signal down into the baseband, the baseband mixing devices preferably provide a digital oscillator generating a carrier frequency expediently specified for the mixing down of the sampled measured signal for the multi-channel system.

BRIEF DESCRIPTION OF THE DRAWINGS

By way of example, an exemplary embodiment of the invention is explained in greater detail below with reference to the drawings. The drawings are as follows.

DETAILED DESCRIPTION OF EXEMPLARY EMBODIMENTS OF THE INVENTION

Corresponding components are provided with identical reference symbols in all the drawings.

Figure 1:
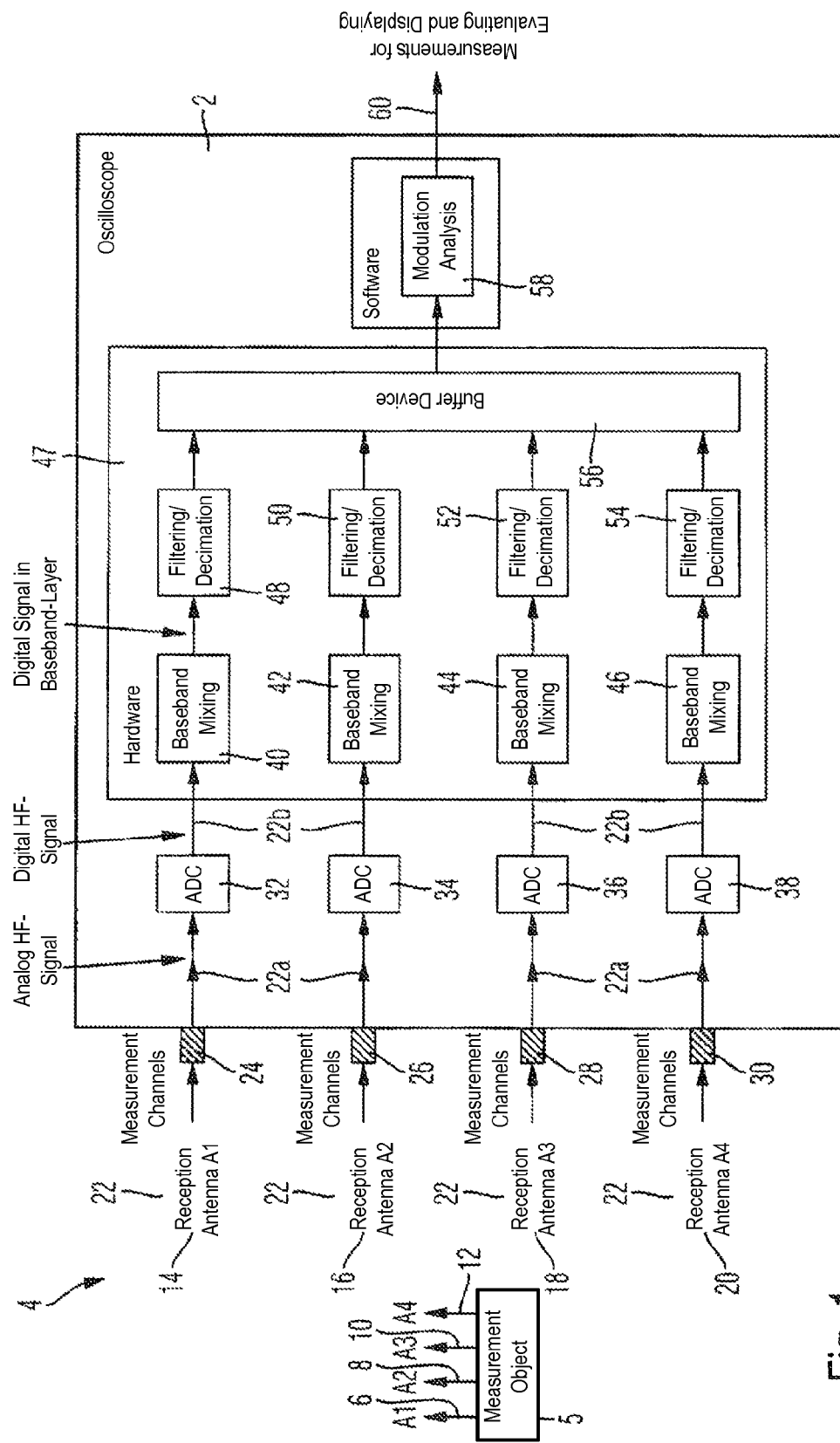
FIG. 1 shows a schematic circuit diagram of an exemplary embodiment of the device for the analysis of a measured signal transmitted via a MIMO system.

FIG. 1 shows a schematic circuit diagram of a device designed as an oscilloscope 2, which is connected to a multi-channel system 4. The multi-channel system 4 in the exemplary embodiment is a MIMO system (multiple-input multiple-output system) and comprises, for example, four transmission antennas 6, 8, 10, 12 disposed on a device under test 5 and four reception antennas 14, 16, 18, 20, across which an analog, high-frequency measured signal 22 is transmitted wirelessly from the transmission antennas 6, 8, 10, 12 to the reception antennas 14, 16, 18, 20.

At the input end, the oscilloscope 2 comprises four measurement channels 24, 26, 28, 30, the number of which corresponds with the number of reception antennas 14, 16, 18, 20 of the multi-channel system 4. Furthermore, for each measurement channel 24, 26, 28, 30, the oscilloscope 2 provides in each case one sampling device 32, 34, 36, 38, to which the high-frequency, analog measured signal 22a, provided via the measurement channels 24, 26, 28, to the oscilloscope 2, is supplied for sampling, wherein the sampling is implemented at the same time in all measurement channels 24, 26, 28, 30. The respective sampling device 32, 34, 36, 38 provides the sampled measured signal 22b as a digital high-frequency signal to a baseband mixing unit 40, 42, 44, 46 connected downstream of the respective sampling device 32, 34, 36, 38 within the measurement channel, which is disposed in a function analyzer 47 of the oscilloscope 2 described in detail with reference to FIG. 2.

The baseband mixing device 40, 42, 44, 46 mixes the sampled measured signal 22b down into the baseband and provides the sampled measured signal 22b as a digital signal in the baseband position to a filter device 48, 50, 52, 54 connected downstream of the baseband mixing device 40, 42, 44, 46. The filter device 48, 50, 52, 54 implements a decimation, that is to say, a reduction of the sampled values of the sampled measured signal 22b and an anti-aliasing filtering for bandwidth reduction. With a comparatively-fast sampling rate of, for example, 10 GHz, the respective filter device 48, 50, 52, 54 decimates the number of sampled values and decimates, for example, 999 of 1000 sampled values with simultaneous anti-aliasing filtering. After this, the measured signal 22 is supplied to a buffer device 56 disposed in the function analyzer 47, connected downstream of the filter device 48, 50, 52, 54 for buffering of the measured data comprising the measured signal 22.

For the analysis, the digital multi-channel measured signal is removed from the buffer device 56 again and supplied to an analysis device 58, for example, realised via software in the oscilloscope 2. The analysis device 58 implements, for example, a modulation analysis, which investigates, for example, the EVM (Error Vector Magnitude) and/or the SNR (Signal Noise Ratio) and/or the modulation depth and/or the I/Q errors, such as I/Q offset or I/Q imbalance. The measured result is supplied via a signal line 60 to an evaluation and/or display device not illustrated in FIG. 1.

Figure 2:
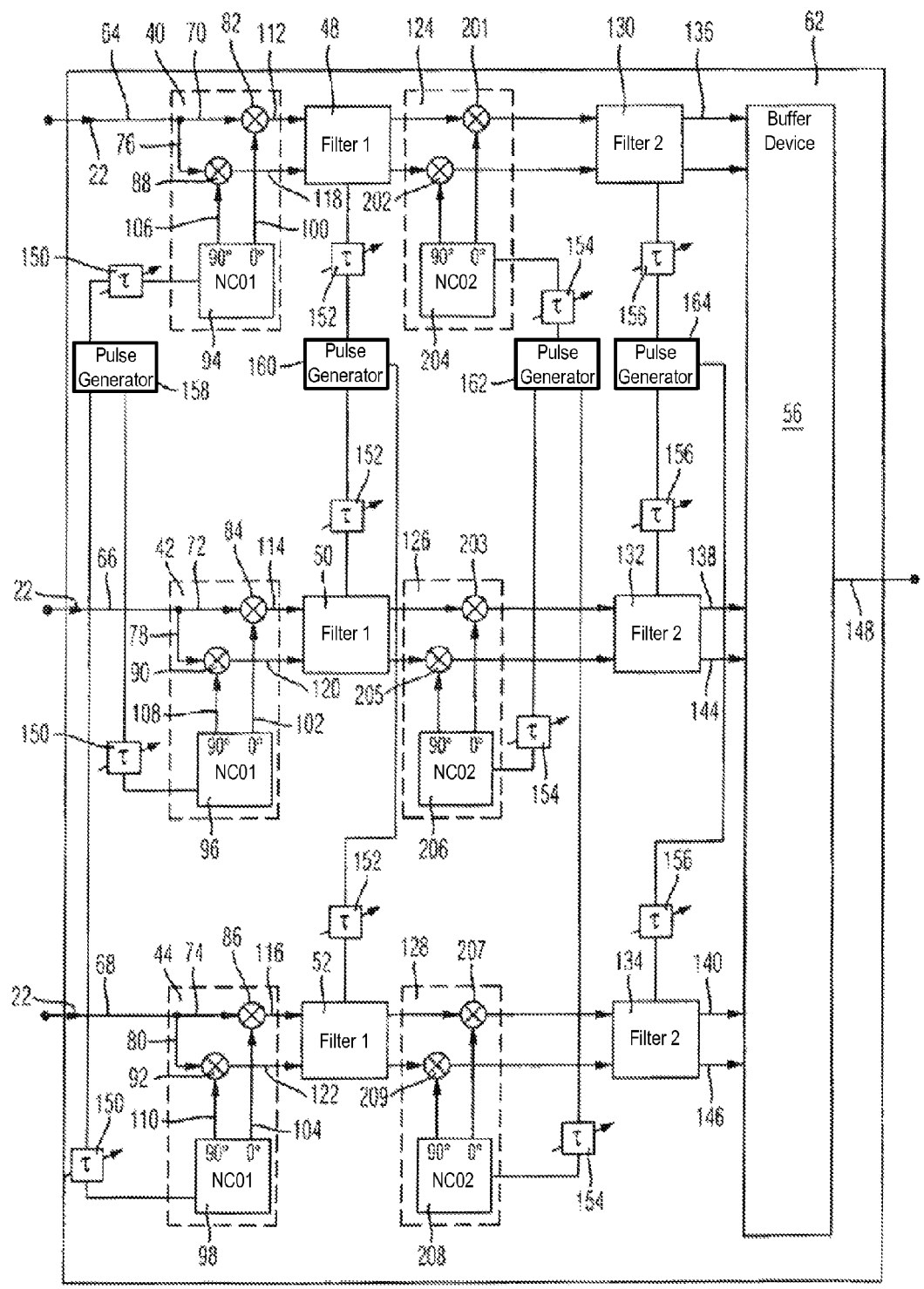
FIG. 2 shows a more detailed schematic circuit diagram of the baseband mixing and filtering from FIG. 1.

FIG. 2 shows a more detailed schematic circuit diagram of a function analyzer 62 for the processing of the measured signal 22 transmitted via the MIMO system. The function analyzer 62 shown in FIG. 2 differs from the function analyzer 47 according to FIG. 1 in the number of measurement channels provided in the latter and in the number of baseband mixing devices and filter devices provided in the latter.

In the example presented, the function analyzer 62 provides three measurement channels 24, 26, 28 with signal lines 64, 66, 68, across which the measured signal 22b, sampled in the sampling devices not illustrated in FIG. 2, which is marked in FIG. 2 with an arrow, is supplied to the respective baseband mixing device 40, 42, 44. In the baseband mixing device 40, 42, 44, the measured signal 22 is supplied via two signal lines 70, 72, 74 and 76, 78, 80 connected to the signal line 64, 66, 68 in each case to two mixers 82, 84, 86 and 88, 90, 82. For mixing down the measured signal 22 from the intermediate-frequency level into the baseband, a carrier frequency, generated by a digital oscillator 94, 96, 98, which is designed in the exemplary embodiment as a numerically-controlled oscillator (NCO), is supplied via signal lines 100, 102, 104 and 106, 108, 110 as a mixer frequency to the respective two mixers or digital multipliers 82, 84, 86 and 88, 90, 82.

In this context, the baseband real component and the baseband imaginary component is generated in the first baseband mixing device 40, 42, 44. For this purpose, a sinusoidal oscillation is generated by the oscillator 94, 96, 99 and supplied via the signal line 100, 102, 104 to the mixer 82, 8, 86 for the generation of the measured-signal real component. For the generation of the measured-signal imaginary component, the oscillator 94, 96, 98 provides a cosine-oscillation phase-displaced by 90° relative to the sinusoidal oscillation for the mixers 82, 84, 86 via the signal line 106, 108, 110 to the mixers 88, 90, 92.

The real component and respectively the imaginary component of the measured signal 22 in the baseband position are provided at the output end via a signal line 112, 114, 116 or respectively via a signal line 118, 120, 122 to the baseband mixing device 40, 42, 44. The measured signal 22 is from now on processed as a complex baseband signal and supplied via the signal lines 112, 114, 116 and 180, 120, 122 to the filter device 48, 50, 52 and for bandwidth reduction for decimation of the number of sampled values of the measured signal 22 in order to avoid aliasing.

A further, second baseband mixing device 124, 126, 128, which corresponds in the exemplary embodiment with the structure of the first baseband mixing device 40, 42, 44, but, by contrast with the first baseband mixing device 40, 42, 44, which is used for coarse mixing, is used for fine mixing of the measured signal 22, is connected at the output end downstream of each filter device 48, 50, 52. Once again at the output end, a further, second filter device 130, 132, 134 for the further decimation of the sampled values and for the further bandwidth reduction of the measured signal 22 is connected downstream of the further baseband mixing device 124, 126, 128. The further filter device 130, 132, 134 is connected at the output end via signal lines 136, 138, 140 and 142, 144, 146 to the buffer device 56 for the recording of the measured signal 22. A signal line 148 connects the buffer device 56 to the analysis device 58 illustrated in FIG. 1.

The delay-time calibration with the time-delay elements and the pulse generators has the purpose of compensating the delay-time differences in the different measurement channels. The device according to the invention is used with a sampling rate of, for example, 10 GHz, that is to say, at the intermediate-frequency level, measured signals with up to 5 GHz are sampled. At these very high frequencies, even slight geometric differences in the signal lines in the individual measurement channels determine relatively large phase differences. It must therefore be assumed that the sampling in the individual sampling devices (analog/digital converters) 32 to 38 in the individual measurement channels is not implemented at the exactly-identical phase position of the measured signal. This must be compensated in the subsequent digital processing by adjusting the phase position of the digital oscillators 94, 96, 98 and respectively 204, 206 and 208 accordingly with reference to the phase position of the digital sinusoidal or cosine signals generated by the latter. Accordingly, the pulse controlling the filters 48, 50, 52 and respectively 130, 132, 134 must be brought forward or held back, so that the timing of the processing there coincides exactly with the corresponding forward or return sampling in this measurement channel.

In order to process the measured signal 22 simultaneously sampled in the sampling devices in a coherent manner in the measurement channels 24, 26, 28, the baseband mixing device 40, 42, 44, the filter device 48, 50, 52, the further baseband mixing device 124, 126, 128 and the further filter device 130, 132, 134 in this schematically-presented exemplary embodiment are each adjusted by a time-delay element 150, 152, 154, 156 for the delay-time calibration of the measurement channels 24, 26, 28. Pulse generators 158, 160, 162, 164 are connected upstream of the time-delay elements 150, 152, 154, 156 in such a manner that, in the example, in each case one pulse generator 158, 160, 162, 164 is provided in the function analyzer 62 for the pulse specification for those time-delay elements 150, 152, 154, 156, which are connected to the first baseband mixing devices 40, 42, 44, to the first filter devices 48, 50, 52, to the further baseband mixing devices 124, 126, 128 or to the further filter devices 130, 132, 134. Accordingly, in the case of the second baseband mixing devices 124, 126, 128, corresponding mixers or digital multipliers 201, 202, 203, 205, 207, 208 and corresponding digital oscillators 204, 206, 208 are provided.

The invention is not restricted to the exemplary embodiment presented in the drawings, in particular, not to an oscilloscope comprising three or four measurement channels. A single pulse generator only may, of course, be provided as an alternative. This is also advantageous, because the individual pulse generators need not then be synchronized with one another. All of the features described above and presented in the drawings can be combined with one another as required.

The invention claimed is:

1. A device for analysis of a measured signal transmitted via a multi-channel system, said device comprising:
   several measurement channels each comprising a sampling, a first baseband mixing device, a first filter device;
   an analysis device,
   wherein the measured signal is supplied to the respective sampling devices of the measurement channels for simultaneous sampling, and
   wherein the sampled measured signal is supplied to the first baseband mixing devices connected downstream of the sampling devices for mixing the measured signal down into a baseband, to the first filter devices connected downstream of the first baseband mixing devices for the decimation of the sampled values of the sampled measured signal in the baseband and to the analysis device connected to the filter devices for the analysis of the measured signal.

2. The device according to claim 1, wherein the measurement channels each comprise a second baseband mixing device connected downstream of the first filter device and a second filter device, which is connected downstream of the respective second baseband mixing device.

3. The device according to claim 2 further comprising a buffer device configured to buffer the measured signal that is connected downstream of the first filter devices or respectively the second filter devices.

4. The device according to claim 2 wherein the first baseband mixing devices and/or the first filter devices or respectively the second baseband mixing devices and/or the second filter devices are configured to delay-time calibration for the synchronization of the measurement channels.

5. The device according to claim 4, further comprising a time-delay element that is connected to the first baseband mixing device, to the first filter device and/or to the second baseband mixing device and to the second filter device for the delay-time calibration.

6. The device according to claim 5, further comprising a pulse generator configured to control the time-delay element, which is connected to the first baseband mixing devices of the measurement channels and to the first filter devices of the measurement channels and/or to the second baseband mixing devices of the measurement channels and to the second filter devices of the measurement channels.

7. The device according to claim 2, wherein the first baseband mixing devices are configured to mix the sampled measured signal into the baseband in a coarse manner.

8. The device according to claim 7, wherein the second baseband mixing devices are configured to mix the measured signal, mixed into the baseband in a coarse manner, accurately into the baseband to generate a baseband real component and a baseband imaginary component.

9. The device according to claim 2 wherein the first baseband mixing devices and/or the second baseband mixing devices comprise digital oscillators, in particular, numerically-controlled oscillators, for the generation of a carrier-mixing frequency.

10. The device according to claim 1 wherein the multichannel system is a multiple-input multiple-output channel system or a single-input multiple-output channel system.

11. A method for analysis of at least one measured signal transmitted via a multi-channel system, which is supplied to several measurement channels, said method comprising:
   sampling the measured signal simultaneously in sampling devices provided in the measurement channels;
   synchronously mixing the measured signal in first baseband mixing devices connected downstream of the sampling devices down into a baseband; and
   synchronously filtering the measured signal in first filter devices connected downstream of the first baseband mixing devices for the decimation of the sampled values in the baseband and subsequently analyzed.

12. The method according to claim 11, wherein the measurement channels are synchronized with one another.

13. The method according to claim 12, wherein the first baseband mixing devices disposed in the measurement channels and/or the first filter devices disposed in the measurement channels are pulse-controlled for the synchronization of the measurement channels.

14. The method according to claim 13,
further comprising generating a baseband real component and a baseband imaginary component in the first baseband mixing devices from the sampled measured signal.

15. The method according to claim 12,
further comprising generating a baseband real component and a baseband imaginary component in the first baseband mixing devices from the sampled measured signal.

16. The method according to claim 11 further comprising generating a baseband real component and a baseband imaginary component in the first baseband mixing devices from the sampled measured signal.

* * * * *